United States Patent [19]
Yoshikawa

[11] Patent Number: 4,734,914
[45] Date of Patent: Mar. 29, 1988

[54] STABILIZED LASER APPARATUS

[75] Inventor: Shozi Yoshikawa, Tokyo, Japan

[73] Assignee: Olympus Optical Co., Ltd., Tokyo, Japan

[21] Appl. No.: 835,557

[22] Filed: Mar. 3, 1986

[30] Foreign Application Priority Data

Mar. 15, 1985 [JP] Japan .................. 60-52020

[51] Int. Cl.⁴ .......... H01S 3/00; H01S 3/04; G01J 1/32; G02F 1/00
[52] U.S. Cl. ........................... 372/33; 372/26; 372/29; 372/31; 372/38; 250/205; 455/613; 455/618
[58] Field of Search ............ 372/26, 29, 31, 33, 372/38, 34; 315/151; 250/205; 455/613, 618

[56] References Cited

U.S. PATENT DOCUMENTS

| | | | |
|---|---|---|---|
| 3,360,650 | 12/1967 | Lawrence ............ | 250/205 |
| 3,949,226 | 4/1976 | Dugan et al. ........ | 250/205 |
| 4,097,732 | 6/1978 | Krause et al. ....... | 250/205 |
| 4,592,057 | 5/1986 | Comerford .......... | 372/26 |

FOREIGN PATENT DOCUMENTS

| | | | |
|---|---|---|---|
| 0061034 | 9/1982 | European Pat. Off. . | |
| 3601300 | 7/1986 | Fed. Rep. of Germany . | |
| 152880 | 12/1979 | Japan ................. | 372/34 |
| 63879 | 4/1982 | Japan ................. | 372/29 |
| 3297 | 1/1983 | Japan ................. | 372/38 |
| 107693 | 6/1983 | Japan ................. | 372/38 |
| 59-90242 | 5/1984 | Japan . | |
| 169182 | 9/1985 | Japan ................. | 372/38 |
| 171863 | 9/1985 | Japan ................. | 372/29 |

Primary Examiner—Eugene R. LaRoche
Assistant Examiner—Michael B. Shingleton
Attorney, Agent, or Firm—Frishauf, Holtz, Goodman & Woodward

[57] ABSTRACT

A stabilized laser apparatus includes a semiconductor laser, a photodetector for detecting an output laser beam from the semiconductor laser, a differential amplifier for comparing the laser detection signal with a first or second reference signal, a window comparator for comparing a threshold range with an output from the differential amplifier, an up/down counter operated in response to an output from the window comparator, and a driving circuit for supplying a drive current to the semiconductor laser in accordance with a count of the up/down counter. A servo loop from the photodetector to the up/down counter is operated in response to an operation instruction signal or an adjustment instruction signal. The drive current is adjusted to coincide with a reference value before operation, and the adjusted drive current is stored in the up/down counter.

8 Claims, 16 Drawing Figures

FIG. 5A (ADJ IN 6)

FIG. 5B (OUTPUT 21 FROM PD 2)

FIG. 5C (OUTPUT 34 FROM D AMP3)

FIG. 5D (OUTPUT FROM AND GATE 43a)

FIG. 5E (OUTPUT FROM AND GATE 43b)

STABILIZED LASER APPARATUS

Background of the Invention

The present invention relates to a stabilized laser apparatus for producing a stable output laser beam with a desired level.

Laser sources with coherent high outputs can be used in a variety of applications. Among the various applications, semiconductor lasers are used as light sources in an optical data processor such as an optical data recording/reproducing apparatus (a so-called optical memory), a laser printer or an optical communication system since semiconductor lasers are solid, compact and lightweight.

In general, a laser source produces a nonlinear output in response to a drive signal and its characteristic is degraded by ambient temperature. In conventional optical data processors, output laser beams from the laser sources are intensity-modulated. High and low laser output pulses are selectively produced in accordance with given applications.

A conventional laser apparatus for stabilizing an output laser beam of a laser source with high and low intensity levels will be described with reference to FIG. 1. The output laser beam from semiconductor laser 1 is detected by photodetector 2. A laser detection signal is compared by differential amplifier 3 with one of reference signals Ra and Rb respectively corresponding to low and high laser outputs. One of signals Ra and Rb is selected by selector 3a. An output from amplifier 3 is supplied to control circuit 4. The input signal to circuit 4 is compared by window comparator 4a with upper and lower threshold values. The comparison result is supplied to up- and down-count terminals of up/down counter 4d through gate circuit 4b. Circuit 4b consists of two AND gates, each of which receives the output from comparator 4a and an output from clock generator 4c. An output from counter 4d is supplied to driving circuit 5 through D/A converter 4e. Circuit 5 has amplifier 5b with feedback resistor 5a, current limiting resistor 5c, and transistor 5d. An output from amplifier 5b is supplied to the base of transistor 5d. A collector current of transistor 5d is supplied to laser 1.

With the above arrangement, the count of counter 4d is changed until a difference between the reference signal Ra or Rb and the output laser, generated by laser 1 and detected by photodetector 2, falls within a predetermined threshold range of comparator 4a. The laser output is stabilized within the predetermined threshold range with respect to signals Ra and Rb by a feedback loop consisting of laser 1, photodetector 2, amplifier 3, and circuits 4 and 5. A drive current supplied to laser 1 is stored as a count value in counter 4d.

The laser output abruptly and greatly varies according to ambient temperature and degradation of the laser source. Since the laser beam is intensity-modulated, the output intensity also varies between high and low levels during operation of the laser. For this reason, the respective high and low laser output levels must be adjusted. Therefore, high and low intensity reference levels Ra and Rb are prepared. The count of the counter 4d is updated only when the reference level applied to the amplifier 3 is switched between Ra and Rb. When the laser intensity level is changed, a predetermined settling time, during which the count of the counter 4d is updated according to the reference level, is required, and the desired output level cannot be produced during the settling time. Thus, it is impossible to instantaneously adjust the laser output intensity level.

The output cannot be controlled during inoperation of the laser. For example, the level of a strong laser beam, for data recording or printing, cannot be controlled during emission of a weak laser beam. The desired, stabilized laser beam cannot be emitted at the beginning of operation. This is because the conventional semiconductor laser does not emit a laser beam unless recording or printing data as operation instruction signals from a host controller are supplied thereto. Therefore, an unstable, strong laser beam is emitted at the beginning of actual use (data recording or printing), damaging the recording medium and causing printing errors. In order to prevent these problems, a dummy medium is set during the adjustment of the laser level. Alternatively, level adjustment must be performed after the recording medium is ejected, and such time-consuming control has rendered the apparatus impractical.

SUMMARY OF THE INVENTION

It is an object of the present invention to provide a stabilized laser apparatus for presetting a drive signal level to produce a laser output of a desired level and emitting a stable laser from the beginning of operation.

In order to achieve the above object of the present invention, there is provided a stabilized laser apparatus comprising a laser source; photodetector for detecting an intensity of a laser beam emitted from the laser source; control circuit for setting a drive signal for the laser source in accordance with a difference between a reference value and an output from the photodetector, the control circuit being provided with a memory function for storing the set drive signal; and adjusting circuit for causing the control circuit to operate at any time, and for setting and storing the drive signal for the laser source in the control circuit.

DETAILED DESCRIPTION OF THE PREFERRED EMBODIMENTS

Figure 1:
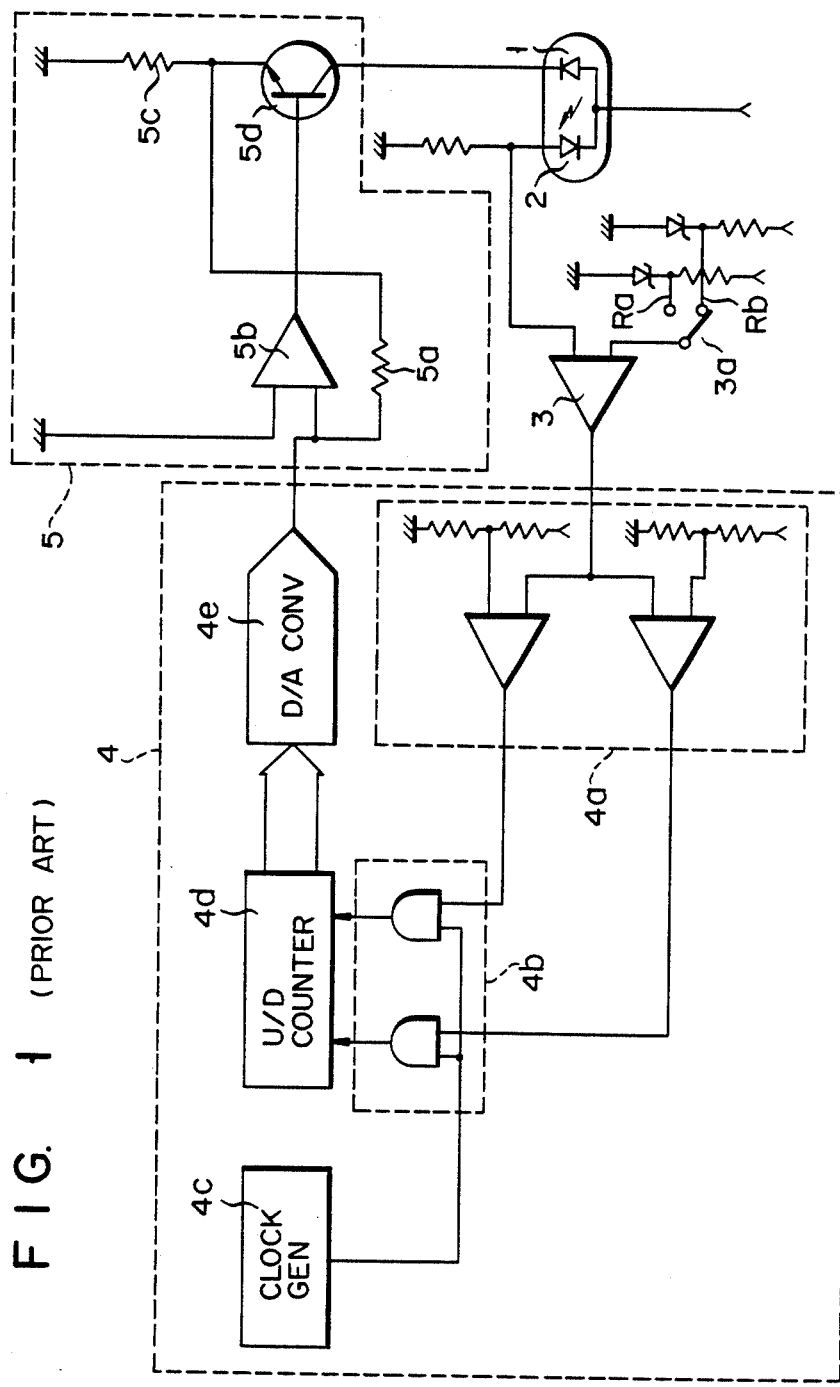
FIG. 1 is a circuit diagram of a conventional stabilized laser apparatus.
Figure 2:
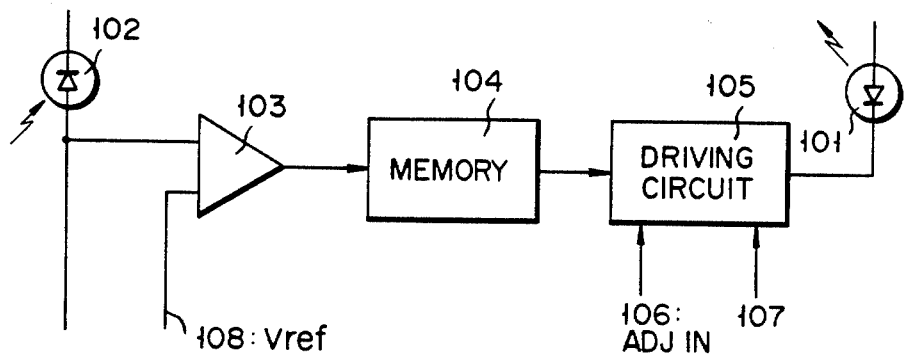
FIG. 2 is a circuit diagram of a stabilized laser apparatus according to a first embodiment of the present invention.

Stabilized laser apparatuses according to preferred embodiments of the present invention will be described with reference to the accompanying drawings. FIG. 2 is a circuit diagram of a stabilized laser apparatus according to a first embodiment. The output laser beam from semiconductor laser 101 is detected by photodetector 102. A laser detection signal is compared by differential amplifier 103 with reference voltage (Vref) 108. The output signal from the amplifier 103 is stored in memory 104. The readout signal from the memory 104 is supplied to driving circuit 105. Circuit 105 also receives adjustment instruction signal (ADJ IN) 106 from an adjustment instruction circuit (not shown) or a host controller (not shown) and control signal 107. Control signal 107, such as a recording data, for causing laser 101 to emit laser beam is supplied from the host controller during the operation of the apparatus. The adjustment instruction signal (ADJ IN) 106 can be input to circuit 105 at desired time irrespective of the control signal 107. Circuit 105 controls laser 101 in accordance with the readout data from memory 104, i.e., the difference between the laser detection signal and the reference signal when the adjustment instruction signal (ADJ IN) 106 or the control signal 107 is supplied thereto. When the laser output from laser 101 is decreased, the drive current is increased. However, when the laser output from laser 101 is increased, the drive current is decreased. Signal 106 is supplied to circuit 105 prior to actual use (before a recording operation) of the apparatus. Therefore, the output laser beam from laser 101 can be controlled prior to actual use, and the corresponding drive current value can be stored in memory 104.

According to the first embodiment, since signal 106 is supplied to circuit 105, the drive current value for any reference value can be arbitrarily adjusted. The adjusted value is then stored in memory 104, so that even if the reference value changes, the drive signal value can be changed accordingly. Therefore, even during operation for recording data in a data recording medium, the intensity of the laser beam from laser 101 can be adjusted. This adjustment can be achieved under a condition wherein a focusing lens for the laser beam is held in a defocused state. Alternatively, adjustment can be performed while a region excluding the recording track of the medium and the printing range is irradiated with the laser beam.

Figure 3:
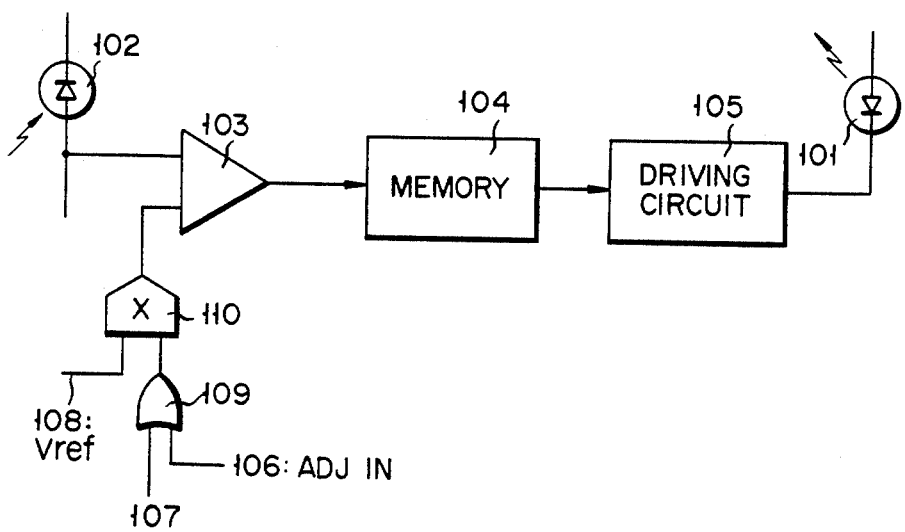
FIG. 3 is a circuit diagram of a stabilized laser apparatus according to a second embodiment of the present invention.

FIG. 3 is a circuit diagram of a second embodiment of the present invention. The second embodiment is substantially the same as the first embodiment except for an input scheme for adjustment instruction (ADJ IN) signal 106.

In the second embodiment, signals 106 and 107 are supplied to multiplier 110 through OR gate 109. Signal 108 is also supplied to multiplier 110. The output signal from multiplier 110 is supplied to differential amplifier 103. If signal 106 or 107 is not supplied to multiplier 110, reference signal 108 is not supplied to amplifier 103 so that the adjustment of the laser beam from laser 101 is not performed. Only when signal 106 or 107 is supplied to multiplier 110, the adjustment of the laser beam from laser 101 is performed.

Figure 4:
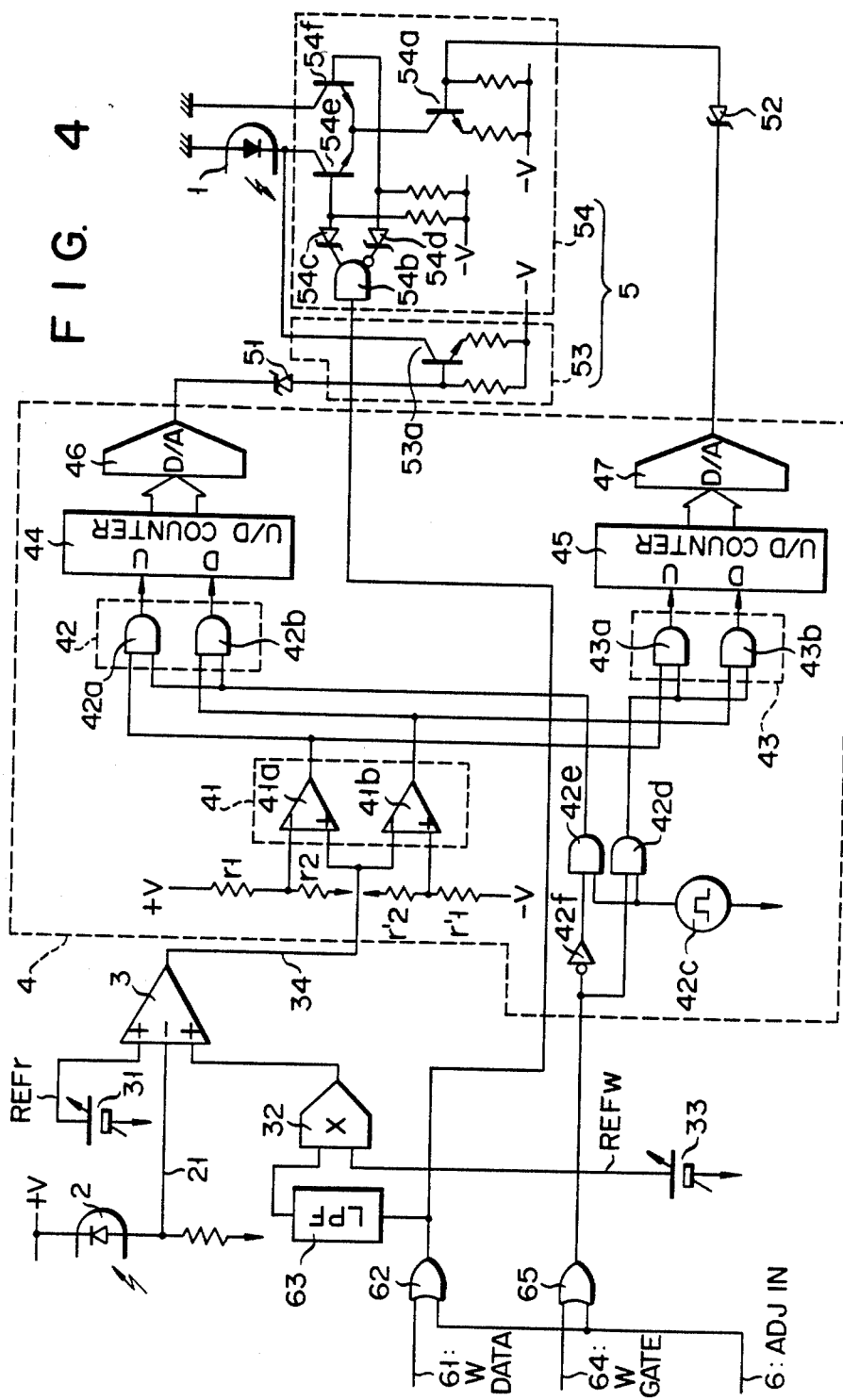
FIG. 4 is a circuit diagram of a stabilized laser apparatus according to a third embodiment of the present invention.

FIG. 4 is a circuit diagram of a third embodiment of the present invention. This embodiment exemplifies a stabilized laser apparatus applied to an optical data recording/reproducing system using an optical disk.

The stabilized laser apparatus includes semiconductor laser (e.g., laser diode) 1, photodiode (e.g., a PIN diode) 2, differential amplifier 3, control circuit 4 and driving circuit 5. Circuits 4 and 5 have separate write and read level adjustment systems.

Photodiode 2 is normally formed integrally with laser 1. An output laser beam from the rear surface of laser 1 is detected by photodiode 2, and is photoelectrically converted to a voltage signal, which is then output. The laser beam from the front surface of laser 1 is incident on an optical disk so as to perform write/read operation. The intensity of the laser beam from the front surface of laser 1 must be proportional to that from the rear surface thereof. Therefore, the laser beam from the rear surface may be regarded to be proportional to that from the front surface. However, for more accuracy, a half mirror can be inserted in an optical path of the laser beam from the front surface of laser 1 to partially guide the write/read laser beam onto photodiode 2.

Amplifier 3 has one inverting input terminal and two noninverting input terminals. An output voltage 21 from photodiode 2 is supplied to the inverting input terminal of amplifier 3. Read reference voltage REFr from power source 31 is supplied to the first noninverting input terminal of amplifier 3.

Signal 6 and write data (W DATA) 61 are supplied to low-pass filter 63 through OR gate 62. Write reference voltage REFw (higher than voltage REFr) from power source 33 and an output from filter 63 are supplied to the second noninverting input terminal of amplifier 3 through multiplier 32. For this reason, only when write data W DATA or signal 6 is supplied to the apparatus, voltage REFw is supplied to amplifier 3.

Filter 63 averages data W DATA to eliminate influences of variations in the duty ratio in the entire control system. However, when a frequency response of multiplier 32 is fast, filter 63 can be omitted. Amplifier 3 generates an output signal representing a difference between the inverting input signal and a sum of the first and second noninverting input signals.

An output from amplifier 3 is then supplied to window comparator 41 in circuit 4. Comparator 41 has comparators 41a and 41b. The output from amplifier 3 is supplied to the noninverting input terminal of comparator 41a and to the inverting input terminal of comparator 41b. A positive reference voltage obtained by dividing positive voltage +V by resistors r1 and r2 is applied to the inverting input terminal of compartor 41a. A negative reference voltage obtained by dividing negative voltage −V by resistors r1' and r2' is applied to the noninverting input terminal of comparator 41b.

An output signal from comparator 41 is supplied to read level control gate circuit 42 and write level control gate circuit 43. Each gate circuit consists of two AND gates. An output from comparator 41a applied with positive reference voltage is supplied to first input terminals of AND gates 42a and 43a. An output from comparator 41b applied with negative reference voltage is supplied to the first input terminals of AND gates 42b and 43b. A clock pulse from clock pulse generator 42c is supplied to the second input terminals of gates 42a and 42b through AND gate 42e. The clock pulse from generator 42c is also supplied to the second input terminals of AND gates 43a and 43b through AND gate 42d. Write gate (W GATE) signal 64 and adjustment instruction (ADJ IN) signal 6 are supplied to gate 42e through OR gate 65 and inverter 42f. An output from gate 65 is also supplied to gate 42d.

Outputs from circuits 42 and 43 are supplied to up-/down counters 44 and 45, respectively. Outputs from gates 42a and 43a are supplied to up-count terminals U of counters 44 and 45. Outputs from gates 42b and 43b are supplied to down-count terminals D of counters 44 and 45.

Outputs from counters 44 and 45 are supplied to D/A converters 46 and 47, respectively. The output terminals of converters 46 and 47 are connected to driving circuits 53 and 54, respectively. An output signal from converter 46 is supplied to drive transistor 53a in circuit 53 through Zener diode 51. A collector current from transistor 53a is supplied to laser 1. An output signal from converter 47 is supplied to drive transistor 54a in circuit 54 through Zener diode 52. A collector current from transistor 54a is supplied to laser 1 through a pair of transistors 54e and 54f. The ON/OFF operation of transistors 54e and 54f is controlled by a "1"/"0" output from gate 62. When transistor 54e is turned on and transistor 54f is turned off, a total of drive currents from circuits 53 and 54 is supplied to laser 1. However, when transistor 54f is turned on and transistor 54e is turned off, only the drive current from circuit 53 is supplied to laser 1.

The operation of the third embodiment will be described.

When data is read out from an optical disk, signal (W GATE) 64 is set at low level. Gate 42b is enabled and gate 42d is disabled. Clock signal 42c is supplied only to circuit 42. A detection signal from photodiode 2 is compared by amplifier 3 with signal REFr. A comparison result from amplifier 3 is then supplied to comparator 41. Pulse 42c from gate 42e is supplied to counter 44 through one of gates 42a or 42b as selected by the output from comparator 41. The count of counter 44 is updated in response to signal REFr.

In the write mode, since signal (W GATE) 64 is set at high level, gate 42d is enabled and gate 42e is disabled. Signal 42c is supplied only to gate 43. The detection signal from photodiode 2 is compared by comparator 41 with the product of output of filter 63 and signal REFw. A comparison result from photodiode 2 is then supplied to comparator 41. Pulse 42c from gate 42d is then supplied to counter 45 through one of gates 43a and/or 43b as selected by the output from comparator 41. The count of counter 45 is updated, and the drive current is controlled in response to signal REFw.

Data (W DATA) 61 is supplied to gate 54b through gate 62. Pulses with opposite phases are supplied from gate 54b to the bases of transistors 54e and 54f through Zener diodes 54c and 54d. Transistors 54e and 54f are then alternately turned on/off when the logic level of data (W DATA) 61 is repeated in a high-low-high order, thereby intensity-modulating the laser output.

Adjustment (ADJ IN) signal 6 is supplied together with signal (W GATE) 64 to a write servo loop through OR gate 65. Therefore, the intensity adjustment of the write laser can be controlled in response to signal 6 irrespective of the presence or absence of signal 64. Signal 6 is supplied to gate 62 and to the bases of transistors 54e and 54f through gate 54b and Zener diode 54c, so that transistor 54e is turned on. Since signal 6 is also supplied to gate 65, gate 42d is enabled and gate 42e is disabled. Signal 6 causes a closed loop consisting of laser 1, photodiode 2, comparator 3, comparator 41, circuit 43, counter 45, converter 47, diode 52, transistor 54a, and transistor 54e to form, to adjust the laser output. For this reason, when a write laser beam is adjusted and the drive current value is stored in counter 45 after signal 6 is input, the instantaneously stabilized laser output is produced when the laser output level is switched from the read level to the write level. It should be noted that signal 6 can be automatically input upon power on operation.

Figure 5:
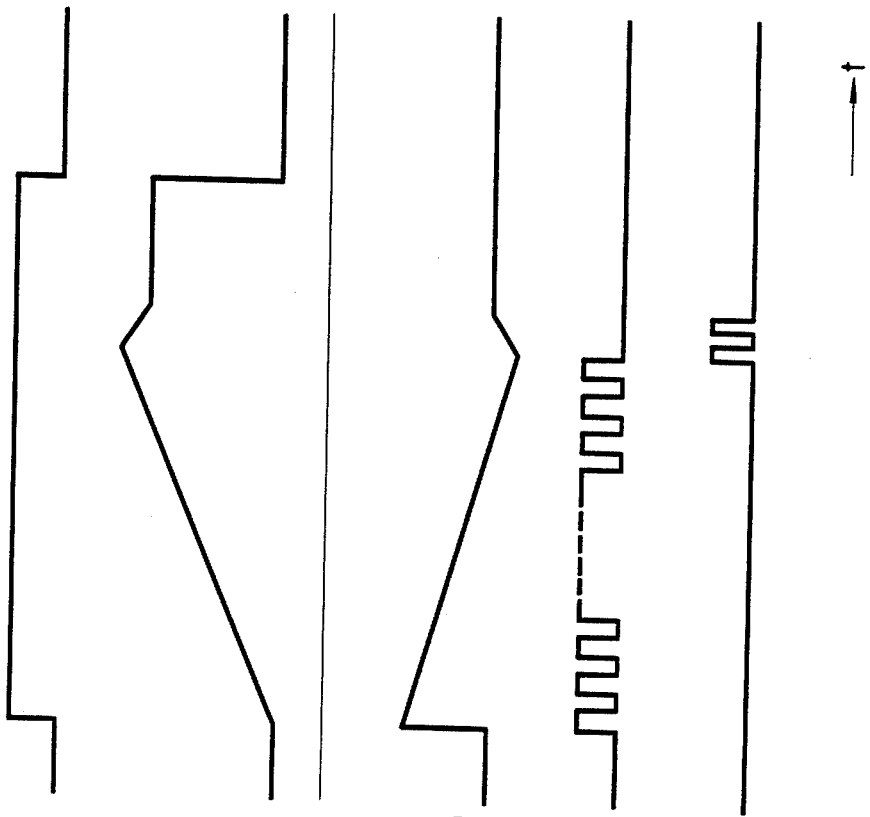
FIGS. 5A to 5E are timing charts for explaining the operation of the third embodiment.

FIGS. 5A to 5E are timing charts for explaining intensity adjustment of the write laser beam in response to signal 6. When signal 6 is generated, as shown in FIG. 5A, transistor 54e is turned on through gates 62 and 54b and diode 54c. A current flows in laser 1 through transistors 54e and 54a to energize laser 1. The output laser beam is detected by photodiode 2, and counter 45 is started in response to the output from photodiode 2 through amplifier 3, comparator 41 and circuit 43. Counter 45 counts up pulses until the detected intensity level reaches a predetermined intensity level. A count of counter 45 is then supplied to circuit 54 through converter 47.

The magnitude of an input signal (detection signal 21 from photodiode 2) to amplifier 3 is increased over time, as shown in FIG. 5B. The magnitude of output 34 from amplifier 3 is decreased over time, as shown in FIG. 5C. During this period, clock pulses are supplied from gate 43a to up-count terminal U of counter 45, as shown in FIG. 5D. Thereafter, when the level of signal 21 from photodiode 2 exceeds that of the product of the reference voltage REFw and the output of filter 63, clock pulses are supplied from the output of gate 43b to down-count terminal D of counter 45, as shown in FIG. 5E. The count of counter 45 is decremented, and the laser intensity is stabilized at a predetermined level.

Figure 6:
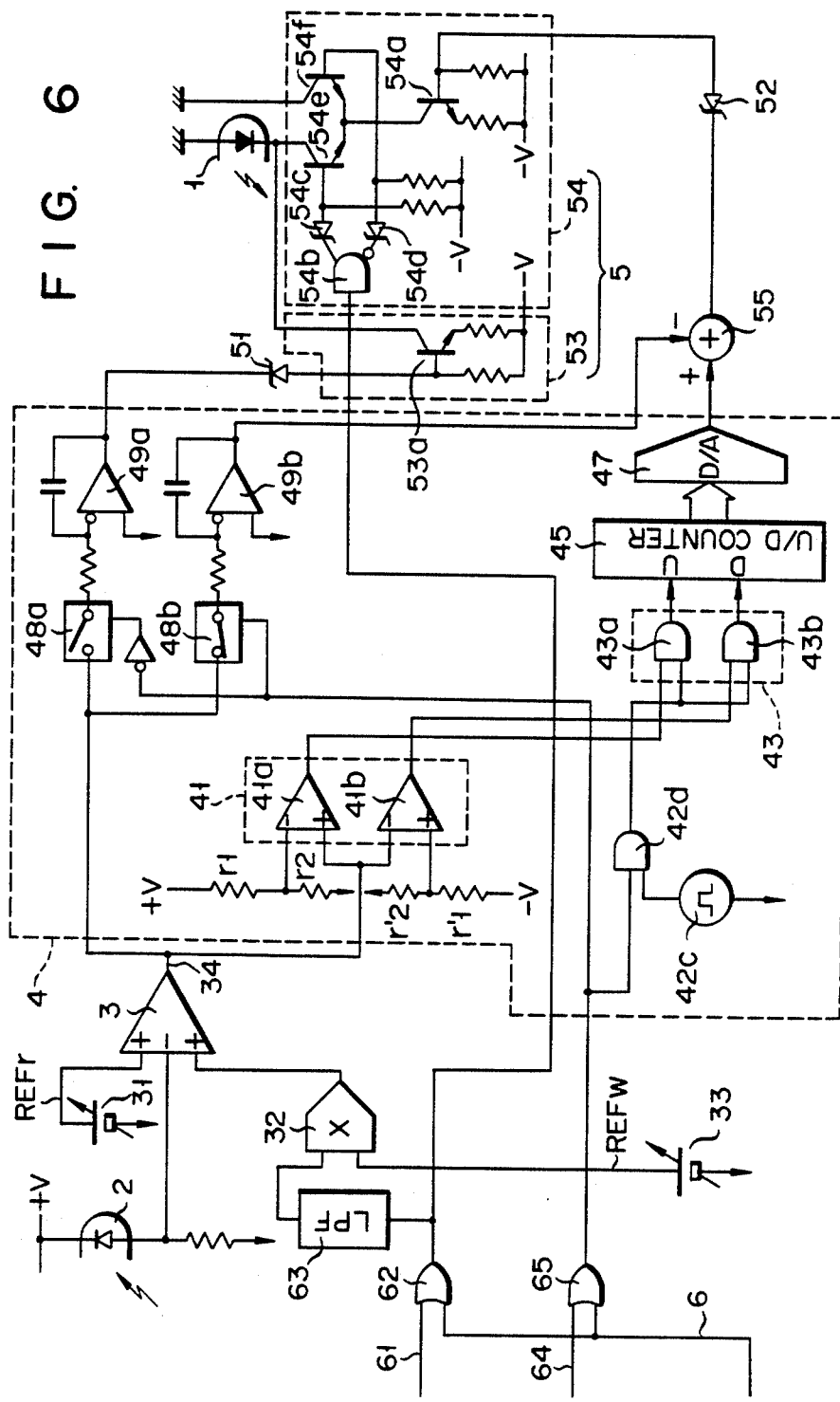
FIG. 6 is a circuit diagram of a stabilized laser apparatus according to a fourth embodiment of the present invention.

FIG. 6 is a circuit diagram of a fourth embodiment of the present invention. The fourth embodiment exemplifies a circuit obtained such that part of circuit 4 of the third embodiment is substituted with an analog circuit. Output 34 from amplifier 3 is supplied to comparator 41 and to integrators 49a and 49b through analog switches 48a and 48b. Switches 48a and 48b and integrators 49a and 49b are used in place of circuit 42, counter 44 and converter 46 of the third embodiment. The ON/OFF operation of switches 48a and 48b is controlled in response to the output from OR gate 65, which receives signals 64 and 6. An output from integrator 49a is supplied to driving circuit 53 through Zener diode 51. An output from integrator 49b is supplied to the inverting input terminal of subtracter 55. An output from converter 47 is supplied to the noninverting input terminal of subtracter 55. An output from subtracter 55 is supplied to driving circuit 54 through Zener diode 52.

With the above arrangement, a control signal corresponding to the output from the amplifier 3 is supplied to driving circuit 5 through the analog switches and the integrators with a memory function. As a result, the laser output is stabilized.

Figure 7:
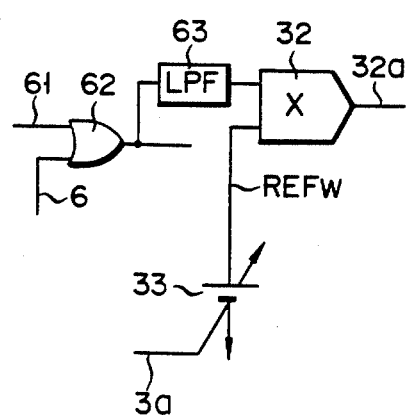
FIG. 7 is a circuit diagram showing a part of a modification of the third and fourth embodiments.
Figure 8:
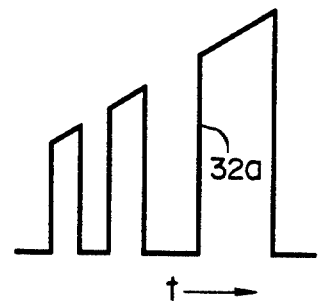
FIG. 8 shows a waveform explaining the operation of FIG. 7.

A modification of the third and fourth embodiments will be described. Since the optical disk is normally rotated at a predetermined angular velocity, a linear velocity of an outer track with respect to the laser beam is higher than that of an inner track. The intensity of the laser beam per unit area at the outer track is lower than that at the inner track. This does not greatly influence the read level. However, the decrease in intensity of the laser beam at outer tracks cannot be neglected in the write level. In order to obtain a uniform laser beam intensity per unit area independent of track position, the laser output must be increased for outer tracks. As shown in FIG. 7, voltage REFw from source 33 must be increased in response to control signal 3a when the track position is separated from the center of the disk. In this case, output 32a from multiplier 32 is gradually increased, as shown in FIG. 8.

Figure 9A:
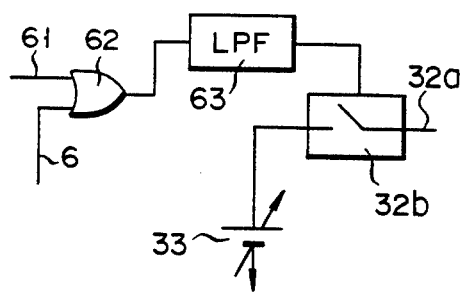
FIGS. 9A, 9B and 9C are circuit diagrams showing a part of other modifications of the third and fourth embodiments.
Figure 9B:
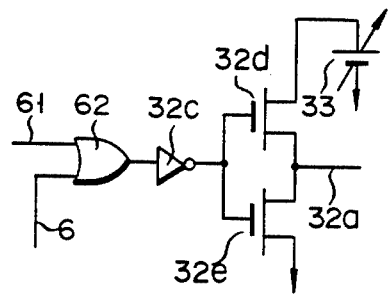
Figure 9C:
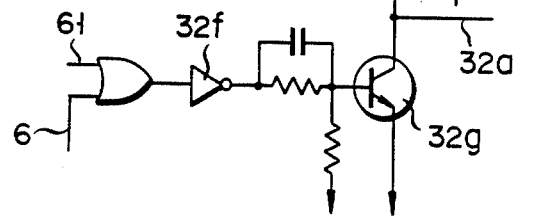

Modifications of multiplier 32 are shown in FIGS. 9A to 9C. Analog switch 32b can be used as multiplier 32, as shown in FIG. 9A. Multiplier 32 can be replaced with a combination (FIG. 9B) of inverter 32c and CMOS gates 32d and 32e or a combination (FIG. 9C) of inverter 32f and open collector transistor 32g.

Figure 10:
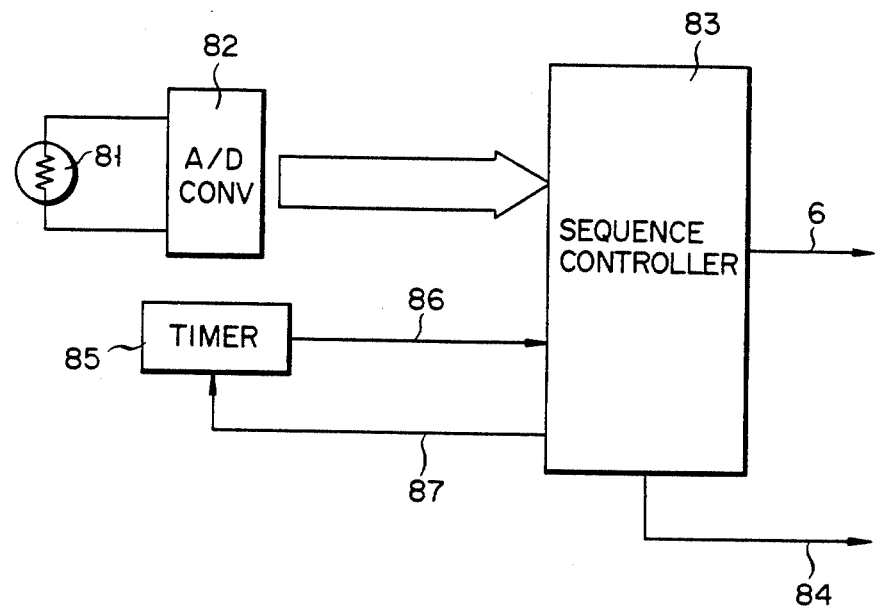
FIG. 10 is a circuit diagram of a stabilized laser apparatus according to a fifth embodiment of the present invention.

FIG. 10 is a block diagram showing the main part of a fifth embodiment of the present invention. This embodiment exemplifies a circuit compatible with changes in ambient temperature and variations as a function of time. An ambient temperature of laser 1 is detected by temperature sensing element 81, and a detection signal from element 81 is supplied to sequence controller 83 through A/D converter 82. When the ambient temperature exceeds a predetermined value, controller 83 generates adjustment instruction (ADJ IN) signal 6. At the same time, controller 83 supplies BUSY signal 84 to the host controller to prevent write/read operation during adjustment.

For every 1,000 hours the semiconductor laser is used, timer 85 supplies time-up signal 86 to controller 83. Controller 83 generates signals 6 and 84 in response to signal 86. Reset signal 87 is supplied from controller 83 to timer 85.

According to the fifth embodiment, the adjustment instruction signal 6 is generated when the semiconductor laser is used over a long time or the ambient temperature exceeds the predetermined value. Therefore, when the output laser beam will be varied or the laser will be degraded, the adjustment of the laser level is automatically started.

According to the present invention as described above, an adjustment instruction is input in advance, and the drive current value can be adjusted to stabilize the laser output. The adjustment result is stored in the storage means. Thus, when the laser output level is changed, a stable laser output can be instantaneously produced. In the above description, the level adjustment is performed only for the write level. However, it is possible to adjust the laser beam of the read level.

What is claimed is:

1. A stabilized laser apparatus, which is adapted to be connected to a host controller and to be operated upon a drive command generated from the host controller, comprising:

laser means for emitting a laser beam in response to a drive signal;

reference signal generating means for generating a reference signal;

photodetecting means for detecting an intensity of the laser beam emitted from said laser means;

driving means for supplying the drive signal to said laser means in accordance with a difference between the reference signal and the intensity of the laser beam when the drive comand is input, said driving means comprising memory means for storing the drive signal; and adjusting means for supplying an adjustment instruction signal to said driving means in the absence of said drive command from said host controller, so that the level of the drive signal is pre-adjusted.

2. A stabilized laser apparatus according to claim 1, in which said driving means comprises means for comparing the intensity of the laser beam detected by said photodetecting means with the reference signal, and gate means for supplying the reference signal to said comparing means in response to one of the drive command or the adjustment instruction signal.

3. A stabilized laser apparatus, comprising:

laser source means for emitting a laser beam in response to a drive signal, including means for modulating the drive signal in accordance with a supplied modulating signal so that the intensity of the emitted laser beam is modulated in accordance with the modulating signal;

photodetecting means for detecting the intensity of the modulated laser beam emitted from said laser source means, and for producing a corresponding ouput signal;

control means for adjusting the drive signal in accordance with a difference between a reference signal and the output signal from said photodetecting means, said control means comprising memory means for storing an adjusted driving signal; and adjusting means for supplying an adjustment instruction signal to said modulating means of said laser source means in the absence of the modulating signal, so that a modulated laser beam is emitted by said laser source means and the drive signal is adjusted by said control means even when the modulating signal is not supplied to said modulating means.

4. An apparatus according to claim 3, in which
   said modulating signal has at least two levels so that the intensity of the emitted laser beam is modulated between said at least two levels;

said control means comprises memory means for storing at least two adjusted drive signals corresponding to said at least two levels of the modulating signal; and said adjusting means comprises means for supplying at least two adjustment instruction signals for said at least two levels of the modulating signals and means for selecting one of said at least two adjustment instruction signals.

5. An apparatus according to claim 3, in which said adjusting means comprises means for detecting an ambient temperature of said laser source means and means for generating the adjustment instruction signal when the ambient temperature of said laser source means exceeds a predetermined temperature.

6. An apparatus according to claim 3, in which said adjusting means comprises means for counting an operation time period of said laser source means and means for generating the adjustment intruction signal when the operation time period of said laser source means exceeds a predetermined time period.

7. An apparatus according to claim 3, in which said control means comprises means for comparing the reference value and the output from said photodetecting means, means for counting a clock pulse in accordance with an output from said comparing means, the count value of said counting means being increased or decreased in accordance with an output from said comparing means.

8. An apparatus according to claim 7, in which said comparing means is a window cmparator for detecting whether or not the output from said photodetecting means falls within a predetermined reference range.

* * * * *